(12) United States Patent
Oda et al.

(10) Patent No.: US 7,388,320 B2
(45) Date of Patent: Jun. 17, 2008

(54) QUARTZ CRYSTAL UNIT AND HOLDING STRUCTURE FOR SAME

(75) Inventors: Seiji Oda, Saitama (JP); Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/180,111

(22) Filed: Jul. 12, 2005

(65) Prior Publication Data

US 2006/0012269 A1    Jan. 19, 2006

(30) Foreign Application Priority Data

Jul. 13, 2004   (JP)   ............. 2004-205975

(51) Int. Cl.
  *H01L 41/053*   (2006.01)
(52) U.S. Cl. ..................................... 310/348
(58) Field of Classification Search ............... 310/348, 310/320, 324, 368, 154–156; 331/68, 158, 331/154–156
See application file for complete search history.

(56) References Cited

U.S. PATENT DOCUMENTS

| | | | |
|---|---|---|---|
| 6,388,363 B1 * | 5/2002 | Kotani et al. ............. | 310/320 |
| 2004/0135471 A1 * | 7/2004 | Arai et al. ................. | 310/324 |

FOREIGN PATENT DOCUMENTS

| | | | |
|---|---|---|---|
| JP | 2000-278080 | * | 10/2000 |
| JP | 2001-119264 | * | 4/2001 |
| JP | 2004-080711 | * | 3/2004 |

OTHER PUBLICATIONS

Machine translation JP-2000-278080.*
Machine translation JP-2001-119264.*
Machine translation of JP 2004-080711.*

* cited by examiner

*Primary Examiner*—Darren Schuberg
*Assistant Examiner*—Derek J Rosenau
(74) *Attorney, Agent, or Firm*—Knobbe Martens Olson & Bear, LLP

(57) ABSTRACT

A crystal unit includes: a crystal blank in which a depression which function as a vibration region is formed; first and second excitation electrodes formed on both principle surfaces, respectively, of the crystal blank in the vibration region; first and second extending electrodes provided so as to extend from the first and second excitation electrodes, respectively, toward the outer periphery of the crystal blank; and a receptacle body. Bonding of the first extending electrode with eutectic alloy at one point of the outer periphery of the crystal blank electrically and mechanically connects the crystal blank to the receptacle body with the one point as the fixed end. The second extending electrode extends as far as the position of the fixed end and is electrically connected to the receptacle body by wire bonding at the position of the fixed end.

8 Claims, 2 Drawing Sheets

QUARTZ CRYSTAL UNIT AND HOLDING STRUCTURE FOR SAME

BACKGROUND OF THE INVENTION

1. Field of the Invention

The present invention relates to a quartz crystal unit for use at high frequencies of, for example, 100 MHz or more, and more particularly to a crystal unit having excellent secular change characteristics and oscillation characteristics, and to a holding structure for the crystal unit.

2. Description of the Related Art

Crystal units in which a quartz crystal blank is accommodated inside a receptacle are incorporated in oscillators as frequency control devices, and particularly, as the reference for communication frequencies. With the increasing use of optical communication in recent years, crystal units with higher oscillation frequencies are now in demand.

In a crystal unit that employs an AT-cut quartz crystal blank, which is a representative crystal blank, the resonance frequency is inversely proportional to the thickness of the crystal blank. To obtain a crystal unit having higher oscillation frequencies, crystal units are being developed in which a depression is provided in the vibration region of the crystal blank and the thickness of the crystal blank in this depression decreased, whereby not only is the oscillation frequency raised, but the vibration region is held and the mechanical strength maintained by the relatively thick portions around the periphery of the depression. This type of crystal blank is disclosed in, for example, U.S. patent application Publication Ser. No. 2004/0135471 A1.

FIGS. 1A and 1B are a plan view and a sectional view showing one example of a crystal unit of the prior art, respectively. FIG. 1A is a plan view showing a state in which cover 10 of the crystal unit has been removed.

The crystal unit is provided with rectangular AT-cut crystal blank 1, crystal blank 1 being accommodated inside receptacle body 2. A circular depression is formed in substantially the central portion of one principle surface of crystal blank 1, and the crystal blank is thinner in the bottom surface of the depression than at the outer periphery, this thin portion being vibration region 3. A pair of substantially circular excitation electrodes 4a and 4b is formed on the both principle surfaces of crystal blank 1 in vibration region 3, respectively. Extending electrodes 5a and 5b are provided on the respective principle surface so as to extend from corresponding excitation electrodes 4a and 4b toward the two opposing ends of crystal blank 1. Each of extending electrodes 5a and 5b connects to a corresponding excitation electrode over approximately half of the outer circumference of the excitation electrode and extends to the outer periphery of crystal blank 1 by way of a fan-like expanding region. This expansion of the connection region between the excitation electrodes and extending electrodes reduces the electrical conductive resistance between the excitation electrodes and the extending electrodes to a low level.

Receptacle body 2 has a depression and is composed of laminated ceramics. A pair of internal terminals 6a and 6b composed of a thick-film metal are formed on the inside bottom surface of receptacle body 2, and internal terminals 6a and 6b are electrically connected to a pair of external terminals 7a and 7b for surface mounting that are provided on the outer surface of receptacle body 2.

Crystal blank 1 is electrically and mechanically connected to receptacle body 2 by securing one end of the crystal blank to which extending electrode 5b is extended on one internal terminal 6a that is provided on the inside bottom surface of receptacle main body 2 by means of eutectic alloy 8. In addition, the other end of crystal blank 1 to which extending electrode 5a is extended is electrically connected to the other internal terminal 6b by wire bonding that uses gold wire 11.

In order to prevent the other end of crystal blank 1 from bending upon wire bonding, the other end of crystal blank 1 is placed on pillow member 9 provided on the inside bottom surface of receptacle body 2. After wire bonding has been completed, the open face of receptacle body 2 is covered by cover 10 to hermetically seal crystal blank 1 inside the receptacle and thus complete crystal unit.

In the crystal unit according to the foregoing description, only one end of crystal blank 1 is secured to receptacle body 2 by eutectic alloy 8, and crystal blank 1 oscillates with this secured end as the fixed end. The other end of crystal blank 1 functions as a free end even though this end is placed on pillow member 9 and connected to gold wire 11 of wire bonding. In this configuration, the securing of crystal blank 1 at only one point prevents the occurrence of distortion caused by the difference in thermal expansion between crystal blank 1 and receptacle body 2, and further, maintains an excellent frequency-temperature characteristic of the crystal unit.

However, in a crystal unit of the above-described configuration, a pillow member 9 is necessary for carrying out wire bonding at the other end of crystal blank 1, and this other end therefore contacts pillow member 9 when crystal blank 1 is oscillating. In other words, the other end of crystal blank 1 is not a completely free end, and the possibility therefore exists for difficulty in initiating vibration at the crystal unit as well as for a deterioration in the characteristics of the crystal unit.

To eliminate this possibility of deterioration, pillow member 9 is preferably removed after carrying out wire bonding, but pillow member 9 is difficult to remove from inside the depression of receptacle body 2 after securing crystal blank 1. This removal becomes particularly difficult with increased miniaturization of the crystal unit. In addition, even if pillow member 9 can be removed, there is the problem of an increased number of fabrication steps.

SUMMARY OF THE INVENTION

It is an object of the present invention to provide a crystal unit that maintains excellent oscillation characteristics.

It is another object of the present invention to provide a holding structure for a crystal unit in which excellent oscillation characteristics are maintained.

The first object of the present invention is achieved by a crystal unit that includes: a crystal blank in which a depression Is formed in at least one principle surface thereof and in which the thickness is reduced in the region of the depression, this region being the vibration region; first and second excitation electrodes formed on both principle surfaces, respectively, of the crystal blank in the vibration region: a first extending electrode provided on one principle surface of the crystal blank so as to extend from the first excitation electrode toward the outer periphery of the crystal blank; a second extending electrode provided on the other principle surface of the crystal blank so as to extend from the second excitation electrode to the outer periphery of the crystal blank; and a receptacle body; wherein bonding of the first extending electrode to a eutectic alloy at one point of the outer periphery electrically and mechanically connects the crystal blank to the receptacle body by the eutectic alloy with the one point as a fixed end; and the second extending electrode extends as far as the position of the fixed end and is electrically connected to the receptacle body by wire bonding at the position of the fixed end.

The second object of the present invention is achieved by a holding structure for holding a crystal blank in which a depression is formed on at least one principle surface thereof and in which the thickness is reduced in the region of the depression, this region being a vibration region. In the holding structure, the crystal blank is provided with: first and second excitation electrodes formed on both surfaces of the crystal blank in the vibration region; a first extending electrode provided on one principle surface of the crystal blank so as to extend from the first excitation electrode toward the outer periphery of the crystal blank; and a second extending electrode provided on the other principle surface of the crystal blank so as to extend from the second excitation electrode toward the outer periphery of the crystal blank; wherein bonding of the first extending electrode to a eutectic alloy at one point of the outer periphery electrically and mechanically connects the crystal blank to a holding member by means of the eutectic alloy with the one point as a fixed end; and moreover, wherein the second extending electrode extends as far as the position of the fixed end and a wire for wire bonding is connected to the second extending electrode at the position of the fixed end.

According to the present invention, wire bonding is realized on the fixed end of a crystal blank, whereby the need for providing a pillow member is eliminated and the other end of the crystal blank functions as a completely free end. A crystal unit can thus be obtained in which excellent oscillation characteristics are maintained.

DETAILED DESCRIPTION OF THE PREFERRED EMBODIMENTS

Figure 1A:
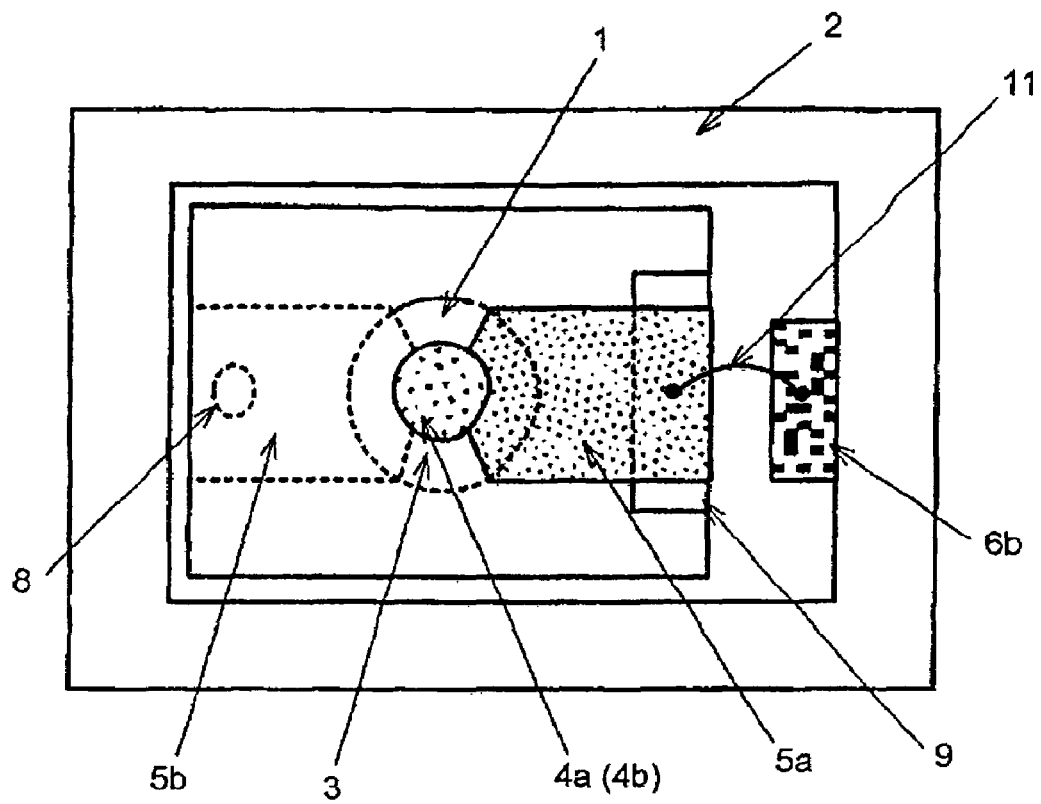
FIG. 1A is a plan view showing an example of a crystal unit of the prior art in a state in which a cover has been removed.
Figure 1B:
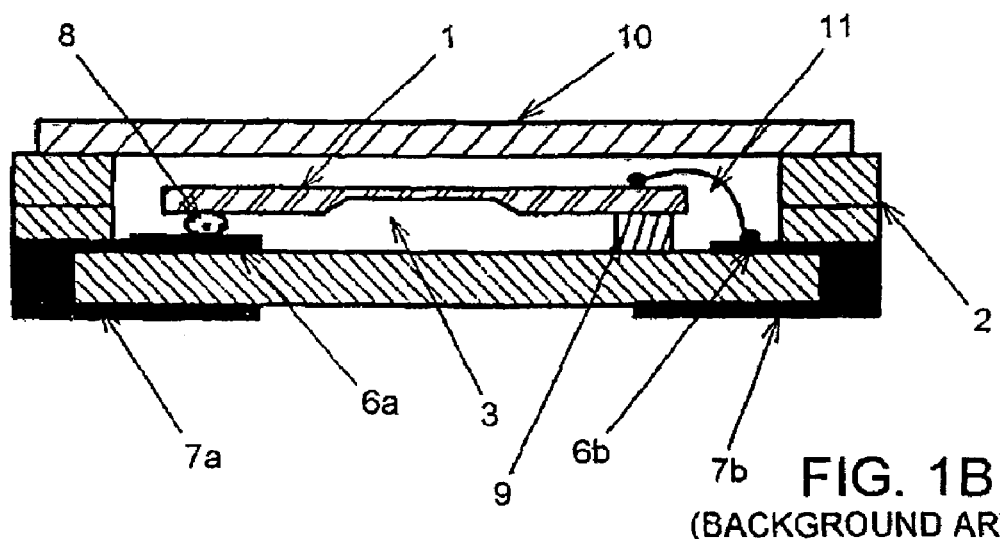
FIG. 1B is a sectional view of the crystal unit shown in FIG. 1A in a state in which the cover is installed.
Figure 2A:
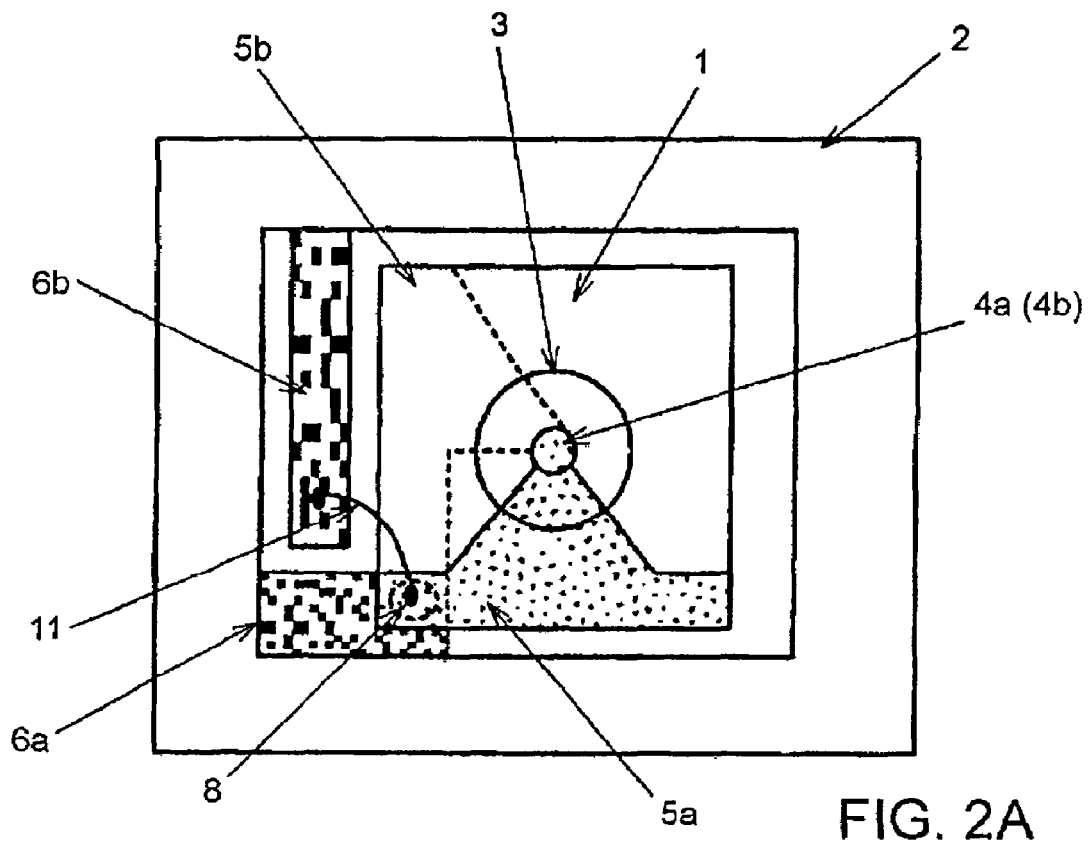
FIG. 2A is a plan view showing a crystal unit according to a first embodiment of the present invention in a state in which a cover is removed.
Figure 2B:
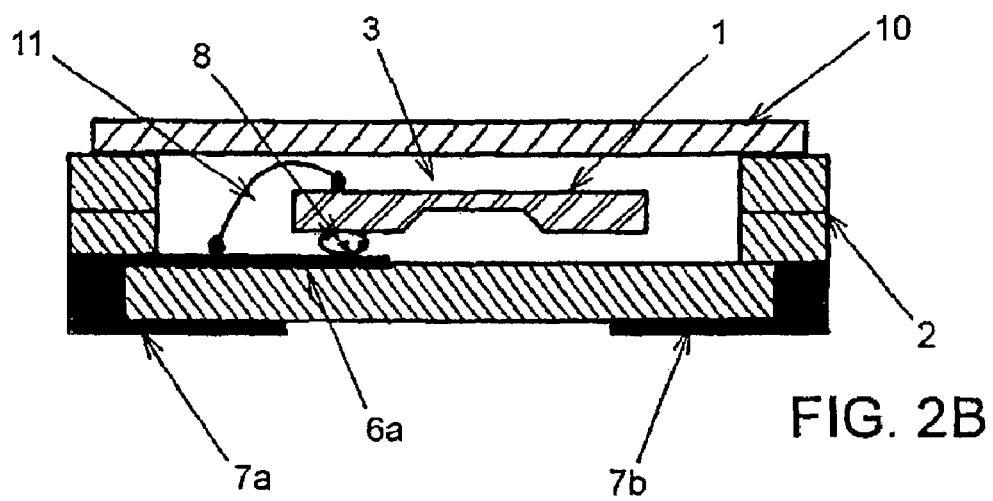
FIG. 2B is a sectional view of the crystal unit shown in FIG. 2A in a state in which the cover is installed.

In FIGS. 2A and 2B that show a quartz crystal unit according to a preferable embodiment of the present invention, constituent elements that are identical to those elements shown in FIGS. 1A and 1B are given the same reference numerals.

The crystal unit according to the present embodiment, as with the above-described crystal unit of the prior art, is a device in which quartz crystal blank 1 is accommodated within a depression of receptacle body 2, following which crystal blank 1 is hermetically sealed within receptacle body 2 by capping with cover 10. Receptacle body 2 also functions as a member that holds crystal blank 1.

Crystal blank 1 is composed of, for example, a substantially rectangular AT-cut quartz crystal blank. A substantially round depression is formed in the central portion of one principle surface of crystal blank 1, the bottom surface of this depression being made thinner than the outer periphery of the crystal blank. The portion in crystal blank 1 that has been made thin is vibration region 3 of the crystal blank, and the oscillation frequency of crystal blank 1 is determined by the thickness of the crystal blank in vibration region 3.

A pair of substantially round excitation electrodes 4a and 4b are formed on the two principle surfaces of crystal blank 1 in vibration region 3. Extending electrodes 5a and 5b are then provided on the both principle surfaces of crystal blank 1, respectively, extending electrodes 5a and 5b extending from excitation electrodes 4a and 4b, respectively, toward the outer periphery of crystal blank 1. Extending electrode 5a is formed so as to connect to excitation electrode 4a at approximately one-half of the outer circumference of this excitation electrode 4a and then expand toward one side of the periphery of crystal blank 1. Extending electrode 5b is formed so as to connect to excitation electrode 4b at approximately one-half of the outer circumference of this excitation electrode 4b and then expand toward the side that is one side of the periphery of crystal blank 1 and that is adjacent to the side to which extending electrode 5a extends. The corner of crystal blank 1 at which these two sides intersect is the position that is to be the fixed end of crystal blank 1, and extending electrodes 5a and 5b overlap each other with crystal blank 1 interposed at the position that is to be this fixed end.

The depression formed in receptacle body 2 is a rectangular shape that can accommodate crystal blank 1, and internal terminals 6a and 6b are formed on the inside bottom surface of receptacle body 2 at the positions of the two ends of one side of this depression, respectively. By the securing of extending electrode 5b to internal terminal 6a by way of eutectic alloy 8 at the corner of crystal blank 1 that is to be the fixed end, crystal blank 1 is electrically and mechanically connected to receptacle body 2 and is held by receptacle body 2. In addition, extending electrode 5a and internal terminal 6b are electrically connected at the position of this fixed end by means of wire bonding realized by gold wire 11. As eutectic alloy 8, a gold-tin (AuSn) alloy, a gold-germanium (AuGe) alloy, a gold-silicon (AuSi) alloy or the like is preferably used.

In the crystal unit according to the above-described configuration, the wire bonding to extending electrode 5a is carried out at the position of the fixed end that is constructed by bonding eutectic alloy 8, and the separate provision of a pillow member for preventing bending of crystal blank 1 during the wire bonding is therefore not necessary. This embodiment can therefore facilitate wire bonding to crystal blank 1 and can make the other end of crystal blank 1 a completely free end. Thus, according to the present embodiment, a crystal unit that maintains excellent oscillation characteristics can be obtained.

What is claimed is:

1. A crystal unit comprising:
a crystal blank in which a depression having a reduced thickness is formed in at least one principle surface thereof, wherein a region of the depression serves as a vibration region;
first and second excitation electrodes formed on the principle surfaces, respectively, in the vibration region;
a first extending electrode provided on one of the principle surfaces and extending from the first excitation electrode toward an outer periphery of the crystal blank;
a second extending electrode provided on the other principle surface and extending from the second excitation electrode toward the outer periphery of the crystal blank; and
a receptacle body, wherein the crystal blank has a single fixed end which is electrically and mechanically fixed to the receptacle body at a single point by bonding the first extending electrode to the receptacle body via an eutectic alloy in the vicinity of the outer periphery of the crystal blank, said crystal blank being mechanically supported only at the single point by the eutectic alloy, and the second extending electrode extends to a position corresponding to the position of the fixed end and is electrically connected to the receptacle body by wire bonding at a single point of the fixed end, and wherein the position at which the wire is bonded to the second extended electrode and the position of the eutectic alloy are in alignment in the thickness direction of the crystal blank, wherein the single fixed end is located and confined at one corner of the crystal blank, and the first and second extending electrodes extend toward the one corner portion and overlap via the crystal blank only at the corner portion as viewed in a thickness direction of the crystal blank.

2. The crystal unit according to claim 1, wherein the crystal blank is an AT-cut crystal blank having a substantially or nearly rectangular planar shape.

3. The crystal unit according to claim 1, wherein the crystal blank is provided with internal terminals, to which the first and second extending electrodes are connected, respectively, wherein the internal terminals are disposed on one side of the receptacle body.

4. The crystal unit according to claim 1, wherein the eutectic alloy is selected from the group consisting of AuSn, AuGe, and AuSi.

5. A holding structure for holding a crystal blank, comprising:

the crystal blank in which a depression having a reduced thickness is formed in at least one principle surface thereof, wherein a region of the depression serves as a vibration region;

first and second excitation electrodes formed on the principle surfaces, respectively, in the vibration region;

a first extending electrode provided on one of the principle surfaces and extending from the first excitation electrode toward an outer periphery of the crystal blank;

a second extending electrode provided on the other principle surface and extending from the second excitation electrode toward the outer periphery of the crystal blank; and a holding member for supporting the crystal blank; and a wire for wire bonding, wherein the crystal blank has a single fixed end which is electrically and mechanically fixed to the holding member at a single point by bonding the first extending electrode to the holding member via an eutectic alloy in the vicinity of the outer periphery of the crystal blank, said eutectic alloy at the single point supporting the entire weight of the crystal blank, wherein the second extending electrode extends to a position corresponding to the position of the fixed end and the wire is connected to the second extending electrode at the single point of the fixed end, and wherein the position at which the wire is boned to the second extended electrode and the position of the eutectic alloy are in alignment in the thickness direction of the crystal blank, wherein the single fixed end is located and confined at one corner of the crystal blank, and the first and second extending electrodes extend toward the one corner portion and overlap via the crystal blank only at the corner portion as viewed in a thickness direction of the crystal blank.

6. The holding structure according to claim 5, wherein the crystal blank is an AT-cut crystal blank having a substantially or nearly rectangular planar shape.

7. The holding structure according to claim 5, wherein the crystal blank is provided with internal terminals, to which the first and second extending electrodes are connected, respectively, wherein the internal terminals are disposed on one side of the holding member.

8. The holding structure according to claim 5, wherein the eutectic alloy is selected from the group consisting of AuSn, AuGe, and AuSi.

* * * * *